United States Patent
Peusens et al.

(10) Patent No.: US 6,505,038 B1
(45) Date of Patent: Jan. 7, 2003

(54) METHOD OF DRIVING A RECEIVER STAGE AND RESPECTIVE APPARATUS

(75) Inventors: Herbert Peusens, Brigachtal (DE); Klaus Clemens, Villingen-Schwenningen (DE)

(73) Assignee: Thomson Licensing S.A., Boulogne (FR)

(*) Notice: Subject to any disclaimer, the term of this patent is extended or adjusted under 35 U.S.C. 154(b) by 0 days.

(21) Appl. No.: 09/460,611

(22) Filed: Dec. 14, 1999

(30) Foreign Application Priority Data

Dec. 14, 1998 (DE) .......................... 198 57 303

(51) Int. Cl.[7] .................................. H04B 1/10
(52) U.S. Cl. .................. 455/310; 455/315; 455/317
(58) Field of Search ............................ 455/310, 317, 455/209, 216, 255, 256, 257, 258, 283, 287, 295, 296, 302, 303, 306, 315, 552, 553

(56) References Cited

U.S. PATENT DOCUMENTS

| | | | |
|---|---|---|---|
| 4,408,348 A | * 10/1983 | Theriault | 455/315 |
| 4,510,461 A | 4/1985 | Dickes et al. | |
| 5,389,898 A | 2/1995 | Taketosh et al. | |
| 5,530,929 A | * 6/1996 | Lindqvist et al. | 455/324 |
| 6,073,000 A | * 6/2000 | Shinohara | 455/310 |
| 6,208,850 B1 | * 3/2002 | Tolson | 455/317 |

FOREIGN PATENT DOCUMENTS

| | | | |
|---|---|---|---|
| DE | 3232155 | 3/1983 | H03L/7/10 |
| DE | 3840999 | 6/1990 | H04B/1/10 |
| DE | 19520691 | 12/1996 | H04B/1/18 |

OTHER PUBLICATIONS

German Search Report dated Aug. 11, 1999.

* cited by examiner

*Primary Examiner*—Lee Nguyen
(74) *Attorney, Agent, or Firm*—Joseph S. Tripoli; Kuniyuki Akiyama

(57) ABSTRACT

Whenever the oscillator frequency is a fraction or a multiple of the received frequency, another received frequency could in turn be there, which would then work as a kind of received disturbance frequency, and thus oscillator pulling occurs, which then severely impairs evaluation of the received signal. The method according to the invention for driving a receiver stage having a selection means, having a control unit and an oscillator is distinguished by the fact that the selection means is driven such that whenever the oscillator frequency is a fraction or a multiple of a received disturbance frequency, this received disturbance frequency is attenuated by the selection means.

7 Claims, 1 Drawing Sheet

METHOD OF DRIVING A RECEIVER STAGE AND RESPECTIVE APPARATUS

BACKGROUND OF THE INVENTION

The invention is based on a method for driving a receiver stage.

Oscillator phase noise is an interfering side effect when an oscillator is intended to cover a large frequency range. This oscillator phase noise can, on the one hand, be improved by optimizing the associated PLL circuit. On the other hand, the oscillator noise can be reduced by using two separate oscillators for a large frequency range. Their ranges are then sufficiently small for the phase noise to be improved.

With this solution, however, the inventor has noticed that whenever the oscillator frequency is a fraction or a multiple of the received frequency, another received frequency could in turn be there, which would then work as a kind of received disturbance frequency, and thus oscillator pulling occurs, which then severely impairs evaluation of the received signal.

SUMMARY OF THE INVENTION

The invention is based on the object of providing a method and apparatus which reduces oscillator pulling.

The method according to the invention for driving a receiver stage having a selection means, a frequency divider or multiplier, a control unit and an oscillator is distinguished by the fact that the selection stage is adjusted such that whenever the oscillator frequency is a fraction or a multiple of a received disturbance frequency, this received disturbance frequency is attenuated by the selection means.

If the input signal is supplied conventionally to a receiver stage not in accordance with the invention, and the isolation between the oscillator and the input stage is not sufficiently high, oscillator pulling occurs, as already mentioned above. For this reason, the invention involves adding and driving the selection stage. The selection stage would then attenuate signals of external origin which oscillate at a similar frequency, such as that of the oscillator frequency, so that these do not have an interfering effect on the receiver stage.

The method of a special embodiment is characterized in that a first oscillator is used for a first received frequency range and a second oscillator is used for a second received frequency range. By splitting up the oscillator working range into two frequency ranges, the phase noise is reduced. In that one or more selection stages are then additionally provided an improved phase noise response is maintained but oscillator pulling is reduced also. The first oscillator works for example at the direct input frequency, the second at a fraction or multiple of the input frequency. The second oscillator would therefore preferably be supported by the method according to the invention.

The method is additionally characterized in that the conversion stage (I/Q demodulator) is allocated a low-pass filter for the first received range and a high-pass filter for the second received range. In this arrangement, the control unit drives advantageously a respective divider or multiplier for the second oscillator, so that another oscillator frequency is then used.

A further possibility is for a divider or multiplier to be driven, whenever the control unit establishes that the oscillator frequency is a fraction or a multiple of the received disturbance frequency, such that another oscillator frequency is used which is then no longer another multiple or a fraction of the received disturbance frequency. This makes it possible to match the selection optimally, so that the output signal from the receiver stage is optimized.

BRIEF DESCRIPTION OF THE DRAWINGS

The invention is explained below with the aid of the drawings and with reference to a plurality of illustrative embodiments. In the drawing.

DESCRIPTION OF THE PREFERRED EMBODIMENTS

Figure 1:
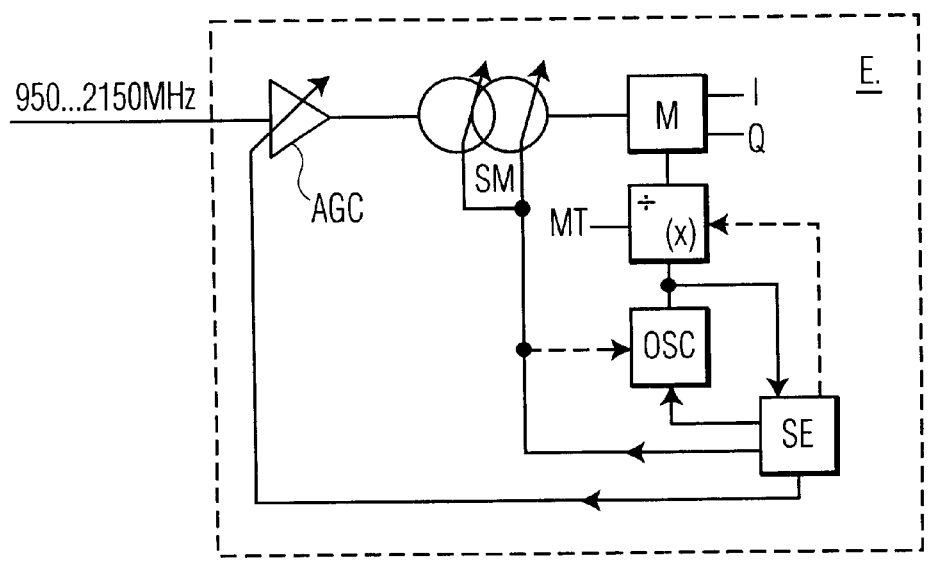
FIG. 1 shows a block diagram according to the invention.

FIG. 1 shows a block diagram according to the invention. The reception channels with input frequencies between 950 and 2150 MHz are present at the AGC-regulated amplifier stage AGC and are passed on from the latter to the selection means SM. The selection means SM are, for example, a bandpass filter, which ideally selects only one selected channel, but normally lets through a plurality of channels. The signals handled in this manner are then passed to the mixer M. The mixer mixes the input signal with the signal which, from the oscillator OSC, has been divided down or multiplied by a divider or multiplier MT. The output signals I and Q are then available at the mixer. The task of the control unit SE is to drive the amplifier stage AGC, the selection means SM and the oscillator OSC, depending on the signal received.

Since, in a directly converting mixing stage, the useful signal is converted down without an intermediate frequency, the frequency from the oscillator as coupled to the mixer is always in the range of the channel frequency to be converted down. As a result, the oscillator frequency can be detuned by the useful signal (oscillator pulling). However, the use of a divider or multiplier between the mixer and the oscillator in this case shifts the oscillator frequency out of the channel range which the selection means let through. A PLL (phase locked loop), including the control unit SE, in this case ensures that the correct oscillator frequency is applied to the mixer M in each case.

If, for example, a useful frequency of 2003 MHz is to be received, the control unit drives the AGC circuit accordingly, so that the appropriate useful signal is passed to the mixer M via the selection stage SM. The control unit SE also drives the divider or multiplication block MT, via the dashed line in FIG. 1, to work as a multiplier, so that, at an oscillator frequency of 1000 MHz, the X2 multiplication means that, on the one hand, the input frequency of 2003 MHz and, on the other hand, the frequency of 2000 MHz are applied to the mixer. The selection is then set by the control unit SE such that corresponding disturbance frequencies which could occur, e.g. 1001 MHz, do not reach the oscillator frequency of 1000 MHz. If the selection cannot be set satisfactorily, the control unit reacts by modifying the oscillator frequency, for example to 500 MHz, and multiplying by 4 to obtain the corresponding 2000 MHz.

Figure 2:
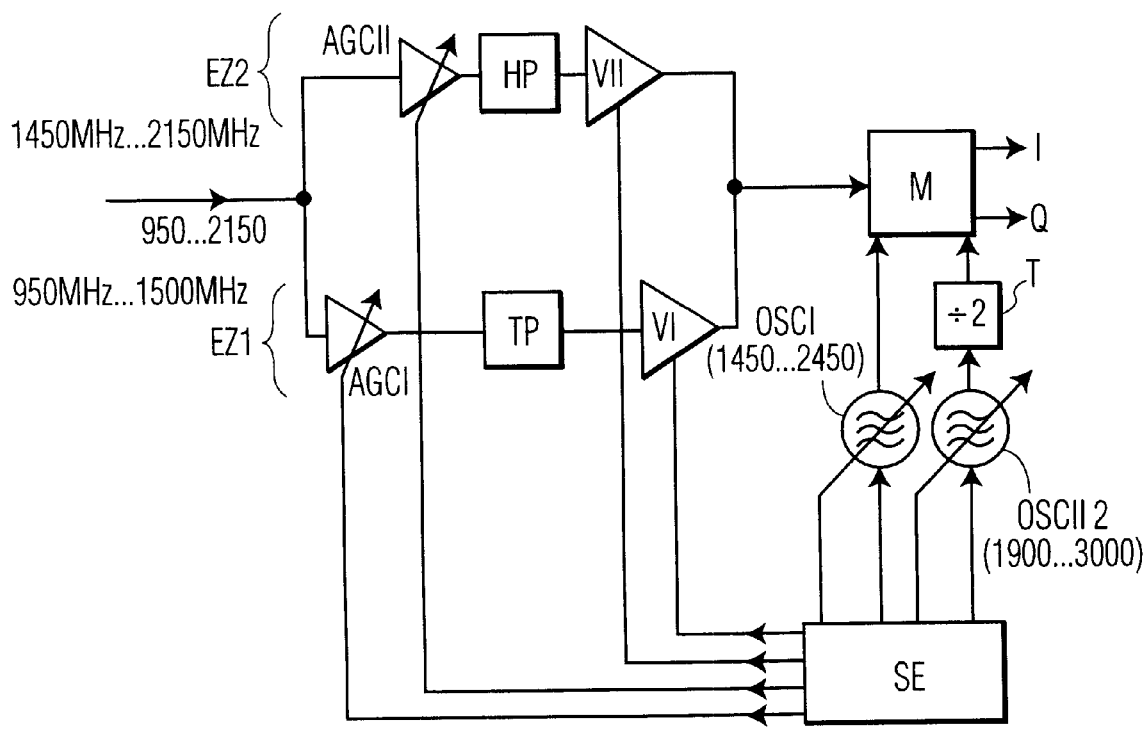
FIG. 2 shows an expanded block diagram of the invention.

FIG. 2 shows an expanded block diagram with a further embodiment of the invention. In FIG. 2, the oscillator range has been split up into oscillator OSCI and OSCII, and the amplifier and the selection means into a lower frequency section for a received range EZ1 with a low-pass filter TP and a first amplifier stage VI and a higher frequency section for a received range EZ2 with a high-pass filter HP and a second amplifier stage VII. Upstream of the second amplifier stage VII, there is the high-pass filter HP which obtains the conditioned received signal via a second AGC controller AGCII. Upstream of the first amplifier, stage VI, there is the low-pass filter TP which obtains the conditioned received signal via a first AGC controller AGCI. The signals are passed from the amplifier stages VI, VII to a mixer stage M.

For the received range EZ1, 950–1500 MHz, oscillator OSCII is active at the operating frequency 1900–3000 MHz. The operating frequency of the oscillator OSCII is passed to a divider T and then to the mixer stage M. In this case, for the received range 950–1500 MHz, the low-pass filter TP in the signal path upstream of the conversion stage M is active here.

For received range EZ2, 1450–2150 MHz, oscillator OSCI is active at the operating frequency 1450–2150 MHz. In this case, a high-pass filter HP in the signal path upstream of the conversion stage M is active. Depending on the desired received frequency, the lower frequency section and oscillator II or the higher frequency section and oscillator I are switched over alternately by the control unit. The control unit SE also has the task of limiting the AGC controllers for the active reception path or the inactivated signal path upstream of the filter stages.

First example: the received frequency is to be 1200 MHz, received range EZ1. In this case, AGC stage AGCI/low-pass filter/amplifier stage VI is working and oscillator II is active at the frequency 2400 MHz. AGC stage II is now limited to the maximum extent and also amplifier stage VII is switched off.

Further example: if an input signal of 1001 MHz is present and the oscillator OSCII is oscillating at 2000 MHz, the frequency after it is divided by 2 and is passed to the mixer as 1000 MHz. If one channel at 2002 MHz, for example, is now present, this channel could result in the oscillator OSCII being pulled, i.e. so-called oscillator pulling occurring. Owing to the low-pass filter in front of amplifier stage VI, this pulling is suppressed.

What is claimed is:
1. A receiver stage comprising
    a selection means,
    a mixer for directly downconverting an input signal, a first oscillator being used for a second received frequency range and a second oscillator being used for first received frequency range,
    at least one of said oscillators being coupled via a frequency divider/multiplier to said mixing stage,
    a control unit for controlling said oscillator, said frequency divider/multiplier and said selection means,
    the frequency of said oscillator being shifted away by said control unit from a desired input frequency in correspondence to said frequency divider/multiplier, and
    said selection means being controlled such that input frequencies corresponding to the oscillator frequency are attenuated by said selection means whenever the oscillator frequency is a fraction or a multiple of a received desired frequency.
2. The receiver stage according to claim 1, characterized in that a high-pass filter is allocated for the second received range and a low-pass filter for the first received range.
3. The receiver stage according to claim 1, characterized in that said control unit drives said frequency divider/multiplier, so that another oscillator frequency is then used.
4. Apparatus for directly downconverting a band of reception channels, comprising
    a mixer for downconverting a reception channel,
    a frequency divider/multiplier and
    at least one oscillator coupled via said frequency divider/multiplier to said mixer,
    a control unit for controlling said oscillator,
    a first input section for a lower input frequency range and a second input section for an upper input frequency range in front of said mixer, and
    said first section for said lower frequency range comprising a low-pass filter as a frequency selection means, and said second section for said higher frequency range comprising a high-pass filter as a frequency selection means, both filters for attenuating inband channels which are equal to the oscillator frequency.
5. Apparatus according to claim 4, wherein for each of said sections a different oscillator is arranged and coupled to said mixer.
6. Apparatus according to claim 5, wherein one or more of said oscillators work at a fraction or a multiple of said input frequency.
7. Apparatus according to claim 4, wherein said apparatus comprises more than two sections in front of said mixer.

* * * * *

| Function | AGCI | AGCII | VI | VII | OSC I 1450–2150 MHz | OSC II 1900–3000 MHz |
|---|---|---|---|---|---|---|
| EZ 1 950–1500 MHz | Active | Attenuation | Active | Switched off (attenuation) | Switched off | Active and tuned |
| EZ 2 1450–2150 MHz | Attenuation | Active | Switched off (attenuation) | Active | Active and tuned | Switched off |